United States Patent [19]

Tsukazaki

[11] Patent Number: 5,368,649
[45] Date of Patent: Nov. 29, 1994

[54] WASHING AND DRYING METHOD

[75] Inventor: Hideo Tsukazaki, Toride, Japan

[73] Assignee: T.H.I. System Corporation, Tokyo, Japan

[21] Appl. No.: 931,377

[22] Filed: Aug. 18, 1992

[30] Foreign Application Priority Data

Jun. 19, 1992 [JP] Japan .................................. 4-184647

[51] Int. Cl.$^5$ ............................................... B08B 3/12
[52] U.S. Cl. ........................................ 134/1; 134/21; 134/26; 134/30
[58] Field of Search .......................... 134/1, 21, 26, 30

[56] References Cited

U.S. PATENT DOCUMENTS 4,871,417 10/1989 Nishizawa et al. .................... 134/21
5,135,608 8/1992 Okutani .............................. 156/643

FOREIGN PATENT DOCUMENTS 1226157 9/1989 Japan .
426123 1/1992 Japan .

*Primary Examiner*—Jose' G. Dees
*Assistant Examiner*—Dwayne C. Jones
*Attorney, Agent, or Firm*—Sughrue, Mion, Zinn, Macpeak & Seas

[57] ABSTRACT

A washing and drying method and apparatus which uses a washing liquid such as pure water or a solvent of the hydrocarbon type but is very high in washing effect and drying effect and allows quick drying and hence a decrease of the drying time and besides can dry a workpiece of a complicated profile uniformly. A washing liquid tank in which washing liquid is accommodated is closed airtight, and the inside of the washing liquid tank is pressurized to a pressure higher than the atmospheric pressure with gas such as air or nitrogen while the washing liquid is heated to a temperature higher than the boiling point it has under the atmospheric pressure. A workpiece to be washed is immersed in the thus pressurized heated washing liquid to wash the same. The thus washed workpiece is moved from within the washing liquid tank into an evaporating drying chamber, which is subsequently isolated airtight from the washing liquid tank. Then, the inside of the evaporating drying tank is decompressed suddenly so that the washing liquid remaining sticking to the workpiece is evaporated at a moment.

8 Claims, 5 Drawing Sheets

WASHING AND DRYING METHOD

BACKGROUND OF THE INVENTION

1. Field of the Invention

This invention relates to a washing and drying method and apparatus wherein workpieces for which high washing achievement is required such as parts of precision or general machines, electronic parts such as semiconductor parts and substrates for electronic parts and optical parts such as lenses are washed with liquid and then dried immediately.

2. Description of the Related Art

Conventionally, workpieces mentioned above are normally washed using an organic solvent having a low boiling point (40° to 80° C. or so under the atmospheric pressure) such as an organic solvent of the fluorine type or the chlorine type as a washing liquid. An exemplary method is disclosed, for example, in Japanese Patent Laid-Open Application No. 1-226157 wherein, when a semiconductor substrate is to be washed and dried, the semiconductor substrate is first placed in position into an enclosed vessel and pure water is supplied into the enclosed vessel to wash the semiconductor substrate, and then, after the water is discharged, organic solvent is supplied into the enclosed vessel to wash the semiconductor substrate and then discharged from the enclosed vessel, whereafter the inside of the enclosed vessel is decompressed to evaporate the organic solvent remaining on the surface of the semiconductor substrate.

Washing with organic solvent described above is advantageous in that it is high in washing performance and can wash and dry also at a room temperature and besides, also when positive drying is required, it allows decompression drying at a room temperature or heating drying under the atmospheric pressure as described above. However, due to the problem of the environmental pollution by organic solvents, the use of organic solvents is restrained strictly.

Meanwhile, conventional washing with pure water is normally followed by drying by blowing of hot wind or using a volatile solvent such as alcohol.

In order to dry with hot wind, however, since gas generally has a low heat conductivity, a large amount of hot wind is required and the time required for drying is long, and accordingly, there is a problem that the drying efficiency is low. Furthermore, when a workpiece to be dried is complicated in profile, hot wind may not be blown directly to a portion of the workpiece, resulting in a problem that the workpiece cannot be dried uniformly.

An improved method has been developed wherein, after a workpiece to be washed is immersed in heated pure water under the atmospheric pressure to wash the workpiece, the inside of the enclosed vessel is decompressed to lower the boiling point of the water so as to promote evaporation of water on the surface of the workpiece to dry the workpiece. In the improved method, however, heating of water under the atmospheric pressure is permitted to a temperature of 80° C. or so at the utmost, and consequently, only an insufficient result of washing and drying can be achieved. This is because, if water is heated to a temperature near 100° C., then a large amount of steam is produced and raises the humidity around the washed workpiece, which produces a contrary effect to drying.

On the other hand, a drying method in which alcohol is used is high in drying effect since alcohol is high in affinity with water and besides low in boiling point. However, since alcohol has a high inflammability, a countermeasure for explosion-proof must be taken and besides exhausting processing is required.

Further, a method of washing a semiconductor wafer with pure water and drying the same is disclosed in Japanese Patent Laid-Open Application No. 4-26123 wherein a semiconductor wafer immersed in pure water is inserted into and enclosed in a chamber and the pressure in the chamber is lowered to $-500$ to $-700$ mmHg or so at a room temperature to cause the pure water to boil and then after the semiconductor wafer is washed, the pressure in the chamber is returned once to the atmospheric pressure and only the pure water is discharged, whereafter the pressure in the chamber is lowered to $-500$ to $-700$ mmHg or so to dry the semiconductor wafer.

The semiconductor wafer washing and drying method, however, does not exhibit a sufficiently high washing effect because pure water is caused to boil at a room temperature. Also the drying effect is insufficient because the semiconductor wafer after washed is dried by decompressing the inside of the chamber while it remains in a room temperature condition.

SUMMARY OF THE INVENTION

It is an object of the present invention to provide a washing and drying method and apparatus which uses a washing liquid such as pure water or a solvent of the hydrocarbon type which is free from the problem of the environmental pollution and has a higher boiling point than ordinary organic solvents but is very high in washing effect and drying effect and allows quick drying and hence a decrease of the drying time.

It is another object of the present invention to provide a washing and drying method and apparatus which can dry a workpiece of a complicated profile uniformly.

In order to attain the objects, according to one aspect of the present invention, there is provided a washing and drying method, which comprises the steps of closing a washing liquid tank, in which washing liquid is accommodated, airtight, pressurizing the inside of the washing liquid tank to a pressure higher than the atmospheric pressure with gas such as air or nitrogen while heating the washing liquid to a temperature higher than the boiling point the washing liquid has under the atmospheric pressure, immersing a workpiece to be washed into the pressurized heated washing liquid to wash the workpiece with the washing liquid, moving the workpiece from within the washing liquid tank into an evaporating drying chamber, isolating the evaporating drying chamber airtight from the washing liquid tank by isolating means, and immediately decompressing the inside of the evaporating drying chamber to a pressure equal to or lower than the atmospheric pressure to evaporate the washing liquid sticking to the workpiece. Where the evaporating drying chamber and the washing liquid tank are provided contiguously to each other so that a workpiece to be washed can be moved directly between them, the closing step may include the step of isolating the washing liquid tank from the evaporating drying chamber by the isolating means. The closing step may further include the step of closing, prior to the isolating step thereof, an entrance of the evaporating drying chamber airtight after a workpiece to be washed has been placed into the evaporating drying chamber, and the washing and drying method may further comprise the steps of pressurizing, subsequently to the pressurizing and heating step, the inside of the evaporating drying chamber to a pressure equal to the internal pressure of the washing liquid tank with gas such as air or nitrogen, and opening the isolating means to allow the workpiece to be subsequently moved from within the evaporating drying chamber into the washing liquid tank and immersed into the washing liquid in the washing liquid tank. The washing and drying method may further comprise the step of opening, after the decompressing step, the entrance of the evaporating drying chamber to open the evaporating drying chamber to the atmospheric air and allow the workpiece to be removed from within the evaporating drying chamber.

Preferably, pure water is used as the washing liquid.

Preferably, at the immersing step, ultrasonic vibrations are generated from an ultrasonic vibration generator in the washing liquid.

Preferably, the washing and drying method further comprise the step of preliminarily washing, prior to the washclosing step, a workpiece to be washed with the washing liquid in a preliminary washing tank into which the washing liquid heated in the washing liquid tank is flowed while fresh washing liquid is supplemented into the washing liquid tank.

According to another aspect of the present invention, the washing and drying method is accomplished by a washing and drying apparatus, which comprises a washing liquid tank in which washing liquid is accommodated, a heater for heating the washing liquid in the washing liquid tank to a temperature higher than the boiling point the washing liquid has under the atmospheric pressure, an evaporating drying chamber formed contiguously to and above the washing liquid tank, selectively operable isolating means for isolating the washing liquid tank and the evaporating drying chamber airtight from each other, a selectively operable lid for closing an opening of the evaporating drying chamber airtight, first pressurizing means for pressurizing the inside of the washing liquid tank to a pressure higher than the atmospheric pressure with gas such as air or nitrogen, second pressurizing means for pressurizing the inside of the evaporating drying chamber to a pressure substantially equal to the internal pressure of the washing liquid tank with gas such as air or nitrogen, vacuum means for decompressing the inside of the evaporating drying chamber to a temperature lower than the atmospheric pressure, and transporting means for transporting a workpiece to be washed upwardly and downwardly between the evaporating drying chamber and the washing liquid chamber.

Preferably, the washing and drying apparatus further comprises a preliminary washing tank communicated with the washing liquid tank for being supplied with the washing liquid from the washing liquid tank.

Preferably, the washing and drying apparatus further comprises heating means disposed in the evaporating drying chamber.

Preferably, the washing and drying apparatus further comprises ultrasonic vibration generating means disposed in the washing liquid in the washing liquid tank for generating ultrasonic vibrations.

In the washing and drying method and apparatus, the washing liquid tank and the evaporating drying chamber are first isolated airtight from each other by the isolating means, and the washing liquid in the washing liquid tank is heated to a temperature higher than the boiling point the washing liquid has under the atmospheric pressure while the internal pressure of the washing liquid tank is kept higher than the atmospheric pressure. For example, when pure water is used as the washing liquid and the inside of the washing liquid tank is pressurized, for example, to 2 Kgf/cm$^2$, since the boiling point of water at 2 Kgf/cm$^2$ is 132.88° C., even if the pure water is heated to 120° C. higher than the boiling point of 100° C. of water under the atmospheric pressure, the pure water will not boil. Accordingly, only a very little amount of steam may be produced.

When a workpiece to be washed is immersed into the washing liquid heated under the conditions described above, it is heated to a temperature equal to that of the washing liquid and washed by the washing liquid. Thus, since the workpiece is immersed, when it is to be washed, in the washing liquid which is heated to a temperature higher than the boiling point the washing liquid has under the atmospheric pressure, a sufficiently high washing effect can be achieved even if a washing liquid such as pure water or a solvent of the hydrocarbon type which is free from the problem of the environmental pollution and has a higher boiling point than ordinary organic solvents is employed in place of an organic solvent. Further, since the surface tension of the washing liquid decreases at a high temperature, the amount of the washing liquid sticking to the workpiece when the workpiece is removed from within the washing liquid is small, and consequently, the drying effect is high. Where ultrasonic vibrations are generated from the ultrasonic vibration generator in the washing liquid, the washing effect is enhanced and besides the surface tension of the washing liquid is further reduced to further enhance the drying effect.

The heated workpiece after washed is moved from the washing liquid tank into the evaporating drying chamber, and the isolating means is closed again to isolate the washing liquid tank and the evaporating drying chamber from each other. Then, the inside of the evaporating drying chamber is decompressed immediately to a pressure lower than the atmospheric pressure. Consequently, the washing liquid remaining sticking to the surface of the workpiece is evaporated at a moment by the residual heat the heated workpiece itself has as well as due to a sudden drop of the boiling point of the washing liquid caused by sudden decompression from a pressure higher than the atmospheric pressure to another pressure lower than the atmospheric pressure. Accordingly, the drying effect is high, and besides the workpiece can be dried uniformly in a short period of time even when it is complicated in profile. The drying effect is further enhanced by heating the workpiece by the heating means provided in the evaporating drying chamber.

After the workpiece is dried in this manner, the evaporating chamber is opened to the atmospheric air and the workpiece is taken out of the evaporating chamber. Since the workpiece thus taken out still has sufficient residual heat, it will not absorb water therearound into a wet condition.

If a workpiece to be washed is heated and washed in the washing liquid tank after it has been washed preliminarily in the preliminary washing tank into which the washing liquid is supplied from the washing liquid tank in which the washing liquid has been heated and into which fresh washing liquid is normally supplemented, then the cleanness of the washing liquid in the washing liquid tank can always be maintained and the washing liquid used once in the washing liquid tank can be utilized effectively to preliminarily wash a workpiece, whereupon the workpiece can be preliminarily heated by the residual heat of the washing liquid itself.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENT

Figure 1:
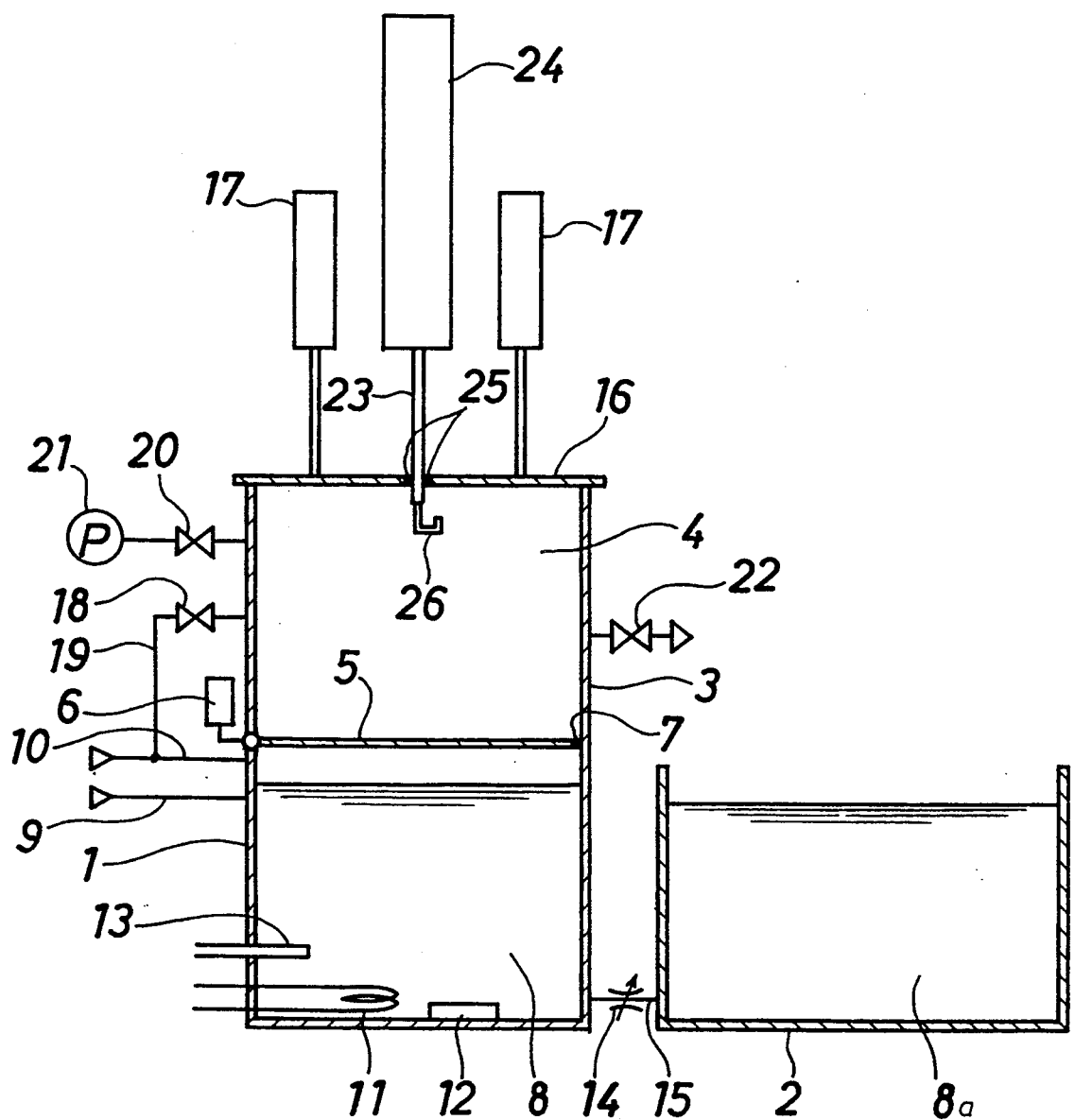
FIG. 1 is a schematic sectional view of a washing and drying apparatus showing a preferred embodiment of the present invention when a shutter is closed to isolate a washing liquid tank from an evaporating drying chamber and the inside of the washing liquid tank is pressurized while pure water is heated by a heater.

Referring first to FIG. 1, there is shown a washing and drying apparatus to which the present invention is applied. The washing and drying apparatus includes a washing liquid tank 1 and a preliminary washing tank 2 disposed in a juxtaposed relationship to each other. A peripheral wall 3 of the washing liquid tank 1 extends upwardly and defines an evaporating drying chamber 4 contiguously to and above the washing liquid tank 1. The washing liquid tank 1 and the evaporating drying chamber 4 can be isolated airtight from each other by a shutter 5 hinged to the peripheral wall 3. The shutter 5 is automatically pivoted between open and closed positions by a shutter opening and closing apparatus 6 and can be locked at its closed position by means of a locking mechanism not shown. Further, when the shutter 5 is at its closed position, the shutter 5 and the peripheral wall 3 are sealed airtight by a packing 7. It is to be noted that the shutter 5 may otherwise be slidably moved horizontally.

Washing liquid such as, for example, pure water is continuously supplemented into the washing liquid tank 1 from the outside by way of a washing liquid supply pipe 9 so that a fixed amount of pure water 8 may always be accommodated in the washing liquid tank 1. Further, nitrogen gas or clean air is supplied under pressure into the washing liquid tank 1 by way of a first gas supply pipe 10 while the shutter 5 is in its closed position so that the inside of the washing liquid tank 1 is pressurized to a pressure higher than the atmospheric pressure.

A heater 11 and an ultrasonic vibration generator 12 of a known structure are disposed on or in the proximity of the bottom of the washing liquid tank 1, and a temperature detector 13 for detecting a temperature of the pure water 8 to turn the heater 11 on or off is disposed above the heater 11. Thus, the pure water 8 is heated, under a pressure higher than the atmospheric pressure, by the heater 11 to a temperature higher than the boiling point (100° C.) the pure water 8 has under the atmospheric pressure while it is acted upon by ultrasonic vibrations generated from the ultrasonic vibration generator 12. The washing liquid tank 1 and the preliminary washing tank 2 are communicated with each other by a connecting pipe 15 having a restrictor 14, and part of the pure water 8 heated in the washing liquid tank 1 is sent out into the preliminary washing tank 2. Since fresh pure water is continuously supplied into the washing liquid tank 1 by way of the washing liquid supply pipe 9, the cleanness of the pure water 8 in the washing liquid tank 1 is always maintained.

The upper opening of the evaporating drying chamber 4 is closed airtight with a lid plate 16. The lid plate 16 is automatically opened or closed upwardly or downwardly by a lid opening and closing cylinder 17 while maintaining its horizontal posture. When a pressurizing valve 18 is opened while the lid plate 16 is closed, nitrogen gas or clean air is supplied under pressure into the evaporating drying chamber 4 by way of a second gas supply pipe 19 similarly to the washing liquid tank 1 so that the inside of the evaporating drying chamber 4 may be pressurized to the equal pressure to that in the washing liquid tank 1. On the other hand, the inside of the evaporating drying chamber 4 can be decompressed to a pressure lower than the atmospheric pressure by a vacuum pump 21 by opening a decompressing valve 20 while the lid plate 16 is in its closed condition. Further, by opening an atmosphere opening valve 22, the inside of the evaporating drying chamber 4 is opened to the atmospheric pressure. It is to be noted that the lid plate 16 may otherwise be constructed for horizontal sliding movement between its open and closed positions.

A transport cylinder 24 for moving a transport rod 23 upwardly and downwardly is disposed above the evaporating drying chamber 4. The transport rod 23 extends through the lid plate 16 into the evaporating drying chamber 4, and a portion thereof at which it extends through the lid plate 16 is sealed airtight with a packing 25. A holding element such as, for example, a hanger 26 for holding thereon a workpiece to be washed is provided at the lower end of the transport rod 23. A workpiece to be washed which is held on the hanger 26 can be moved downwardly from within the evaporating drying chamber 4 into the washing liquid tank 1 and reversely upwardly from within the washing liquid tank 1 into the evaporating drying chamber 4 by the transport cylinder 24.

A washing and drying apparatus of the construction described above was produced actually, and a washing and drying test was performed with the washing and drying apparatus in the following manner.

First, the shutter 5 was closed as shown in FIG. 1 and the inside of the washing liquid tank 1 was pressurized to 2 Kgf/cm$^2$ with nitrogen gas. Then, pure water 8 in the washing liquid tank 1 was heated to 120° C. while ultrasonic vibrations of a frequency higher than 400 KHz were generated from the ultrasonic vibration generator 12. Since the boiling point of water under 2 Kgf/cm$^2$ is 132.88° C., even if pure water is heated to 120° C. higher than the boiling point of 100° C. of pure water under the atmospheric pressure, it does not boil. In this case, the temperature of the pure water 8$a$ in the preparatory washing tank 2 open to the atmosphere was 70° C.

Figure 2:
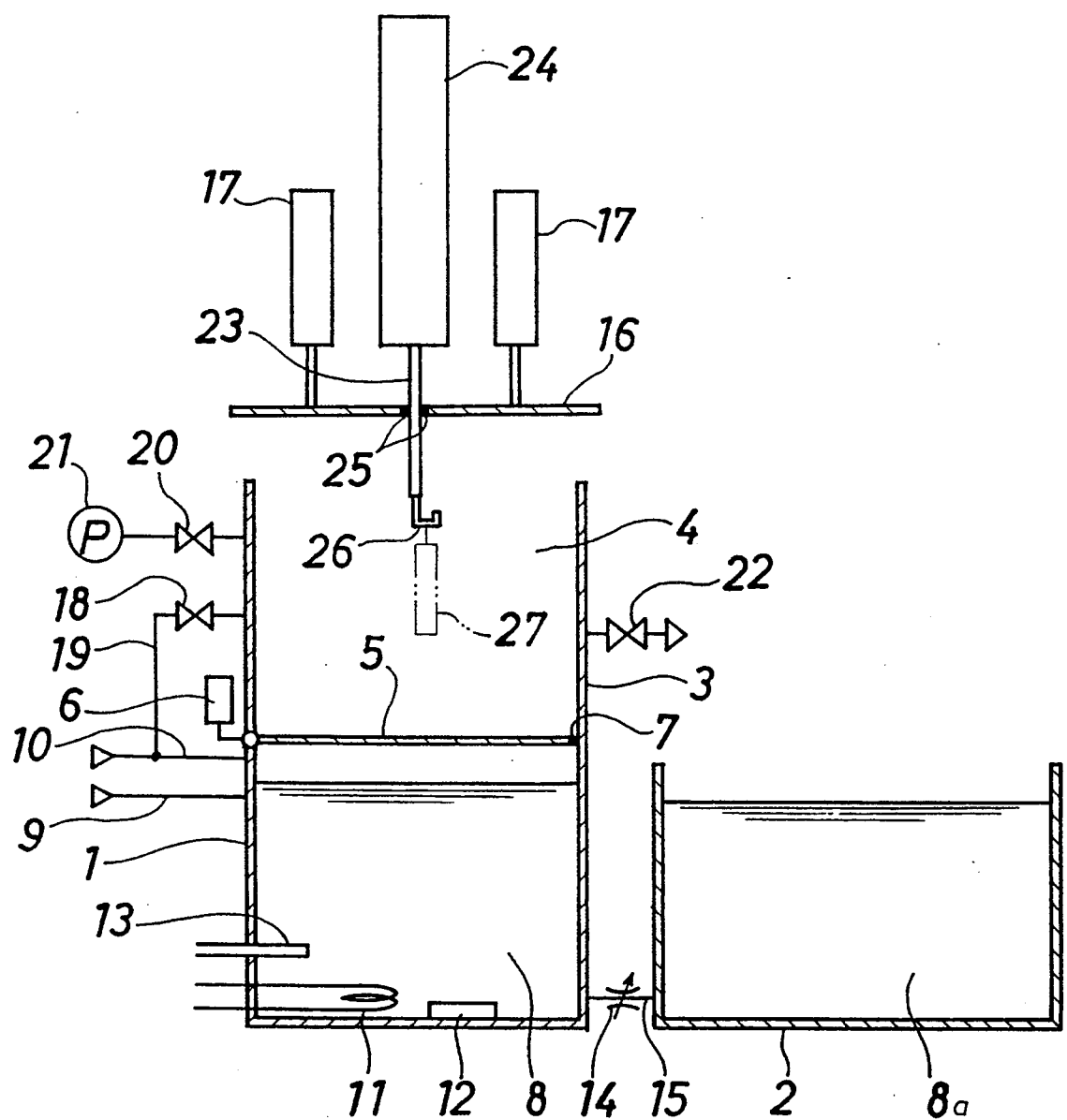
FIG. 2 is a similar view but showing the washing and drying apparatus in another condition wherein a lid plate of the evaporating drying chamber is opened and a workpiece to be washed is suspended on a hanger of a transport rod.
Figure 3:
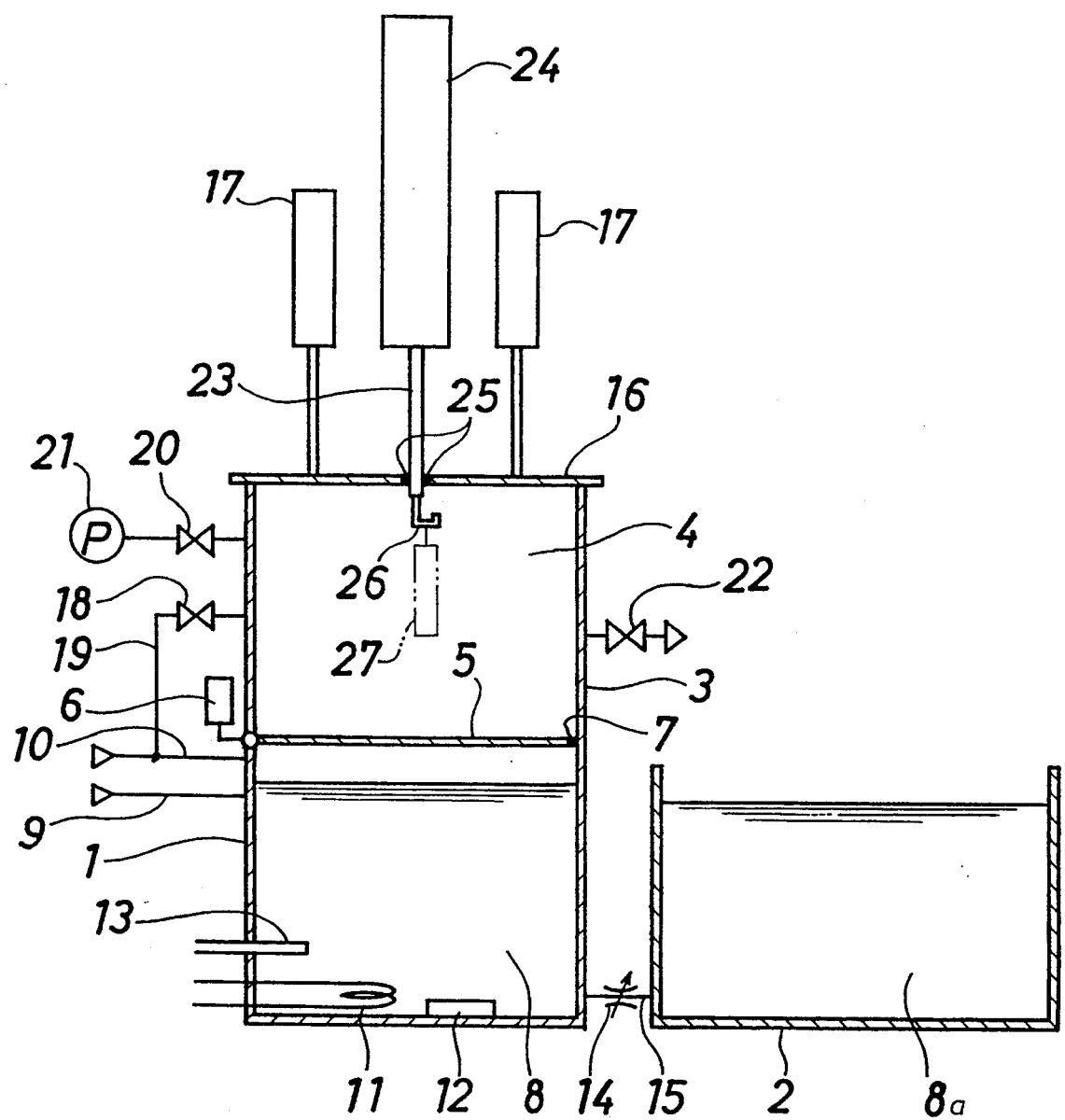
FIG. 3 is a similar view but showing the washing and drying apparatus in a further condition wherein the lid plate is closed and the inside of the evaporating drying chamber is pressurized to the same pressure as the inside of the washing liquid tank.

Subsequently, the lid plate 16 was opened while the shutter 5 was kept closed as shown in FIG. 2, and a stainless steel part immediately after having preliminarily washed with pure water 8$a$ in the preliminary washing tank 2 was suspended as a workpiece 27 to be washed onto the hanger 26. Then, the lid plate 16 was closed as shown in FIG. 3 and the pressurizing valve 18 was opened so that the inside of the evaporating drying chamber 4 was pressurized to 2 Kgf/cm$^2$ equal to the pressure in the washing liquid tank 1 with nitrogen gas.

Figure 4:
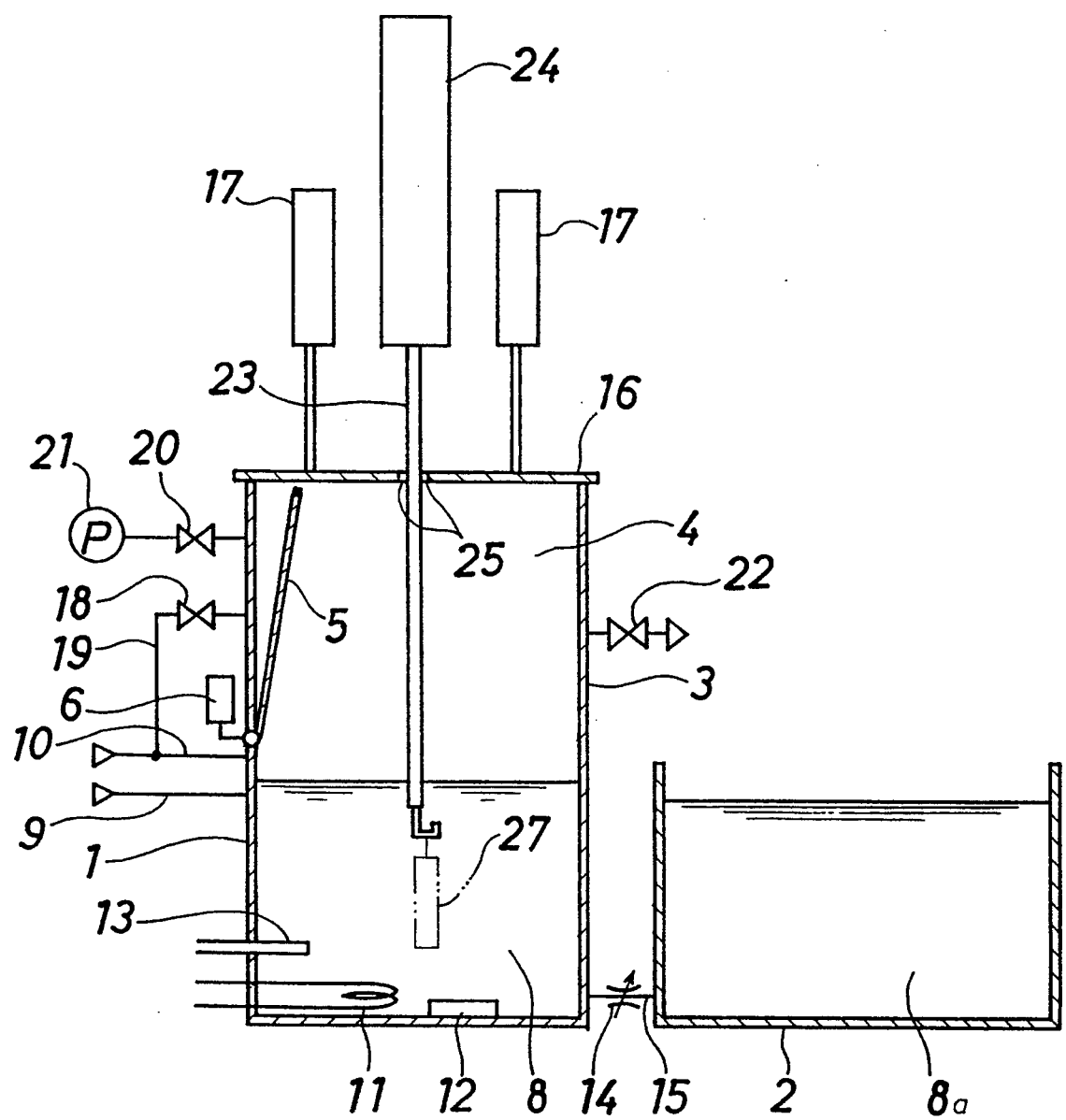
FIG. 4 is a similar view but showing the washing and drying apparatus in a still further condition wherein the shutter is opened and a workpiece to be washed is immersed in pure water to wash the same.

Subsequently, the shutter 5 was opened as shown in FIG. 4 while the lid plate 16 was kept closed, and while the insides of the washing liquid tank 1 and the evaporating drying chamber 4 were kept at the air pressure of 2 Kgf/cm$^2$, the transport rod 23 is moved down by the transport cylinder 24 until the workpiece 27 to be washed was immersed into the pure water 8 in the washing liquid tank 1. After lapse of 2 minutes after starting of the immerse, the temperature of the workpiece 27 reached 120° C. which was the same temperature as the pure water 8.

Figure 5:
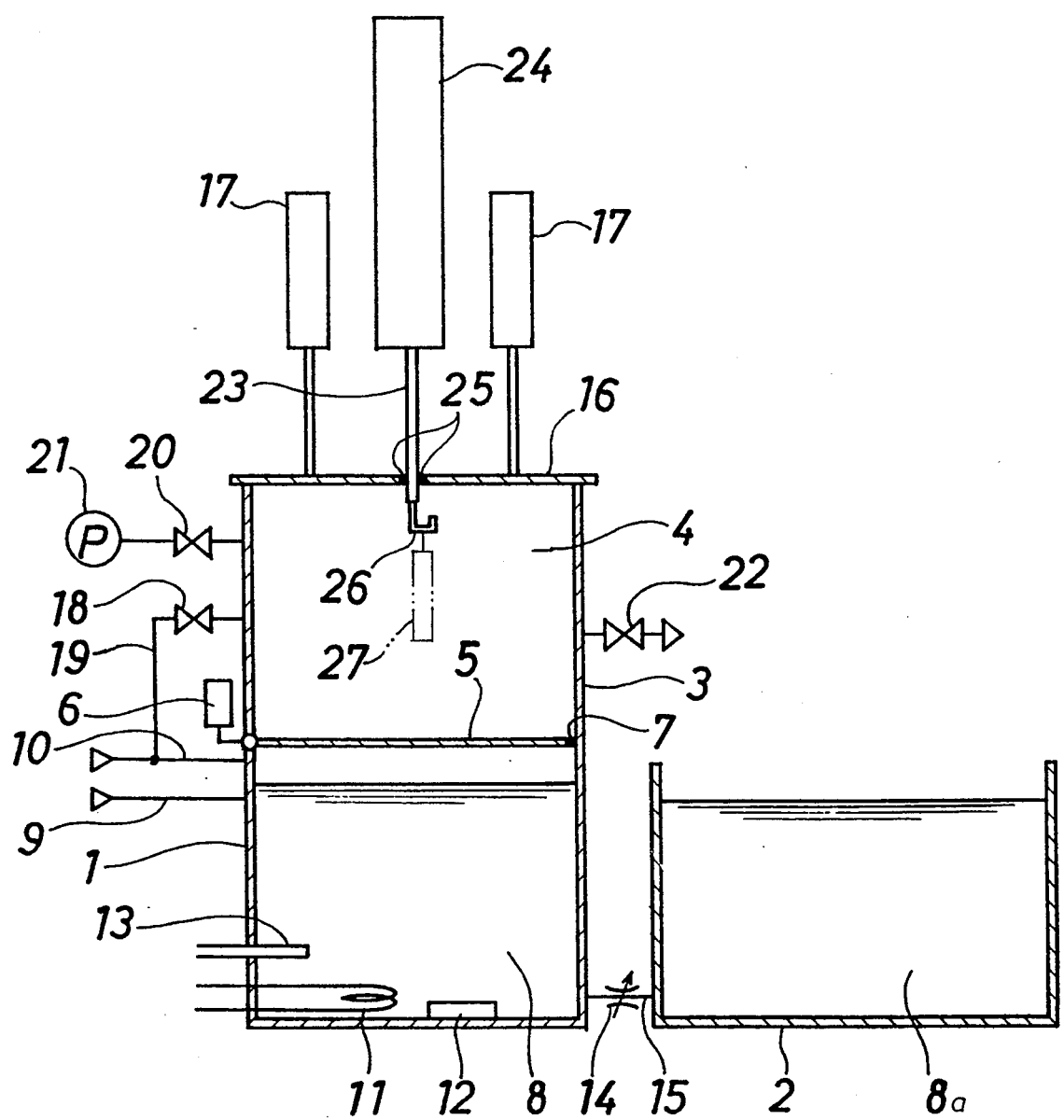
FIG. 5 is a similar view but showing the washing and drying apparatus in a yet further condition wherein the shutter is closed after the workpiece washed is taken out of pure water and transferred to the evaporating drying chamber and the inside of the evaporating drying chamber is decompressed to a pressure lower than the atmospheric pressure to dry the workpiece.

Then, the transport rod 23 was moved up by the transport cylinder 24 to remove the workpiece 27 from the pure water 8 and transport the same into the evaporating drying chamber 4, whereafter the shutter 5 was closed again as shown in FIG. 5 and the atmosphere opening valve 22 was opened so that the pressure in the evaporating drying chamber 4 was made equal to the atmospheric pressure once. Then, the atmosphere opening valve 22 was closed while the decompressing valve 20 was opened to decompress the inside of the evaporating drying chamber 4 to a pressure below the atmospheric pressure. After lapse of one minute and 20 seconds after starting of the decompression, the pressure in the evaporating drying chamber became −530 mmHg.

Since the boiling point of water when the air pressure is −530 mmHg is about 68° C., water sticking to the surface of the workpiece 27 boiled simultaneously upon decompression due to the fact that the workpiece 27 itself still had a temperature around 120° C., and steam of the water was exhausted due to the decompressing operation of the vacuum pump 21. Consequently, the workpiece 27 was dried in a moment.

Finally, the decompressing valve 20 was closed while the atmosphere opening valve 22 was opened to open the evaporating drying chamber 4 to the atmosphere, and then the lid plate 16 was opened and the workpiece 27 was taken out. The workpiece 27 thus exhibited a completely dried condition and besides a sufficiently washed condition free from stains or the like. The surface temperature of the workpiece 27 still was about 90° C., and external water did not stick immediately to the workpiece 27.

It is to be noted that, while, in the washing and drying method described above, the shutter 5 was kept in an open condition when the workpiece 27 was immersed in the pure water 8, if otherwise the workpiece 27 is let off from the transport rod 23 and immersed in the pure water 8 and then the shutter 5 is closed and the transport rod 23 is kept within the evaporating drying chamber 4 during immerse of the workpiece 27, then the transport rod 23 can be protected from the heat of the pure water 8.

Further, while the evaporating drying chamber 4 is formed contiguously to the upper side of the washing liquid tank 1, it may otherwise be provided separately alongside the washing liquid tank 1. Furthermore, while the workpiece 17 was taken out of the pure water 8 and placed into the evaporating drying chamber 4 and thereafter the evaporating drying chamber 4 was opened once to the atmosphere and then the inside thereof was decompressed to a pressure below the atmospheric pressure by the vacuum pump 21, when a very high degree of dryness is not required for the workpiece, it may otherwise be taken out from within the evaporating drying chamber 4 immediately after the evaporating drying chamber 4 is opened to the atmosphere. In addition, the washing liquid is not limited to pure water and may be some other washing liquid such as washing liquid of the hydrocarbon type which does not cause the problem of the environmental pollution but has a boiling point which is higher than those of ordinary organic solvents.

Having now fully described the invention, it will be apparent to one of ordinary skill in the art that many changes and modifications can be made thereto without departing from the spirit and scope of the invention as set forth herein.

What is claimed is:

1. A washing and drying method, comprising the steps of:
    closing a washing liquid tank, in which washing liquid is accommodated, airtight;
    pressurizing the inside of said washing liquid tank to a pressure higher than the atmospheric pressure with gas while heating the washing liquid to a temperature higher than the boiling point the washing liquid has under the atmospheric pressure;
    immersing a workpiece to be washed into the pressurized heated washing liquid to wash the workpiece with the washing liquid;
    moving the workpiece from within said washing liquid tank into an evaporating drying chamber;
    isolating said evaporating drying chamber airtight from said washing liquid tank by isolating means; and
    immediately decompressing the inside of said evaporating drying chamber to a pressure equal to or lower than the atmospheric pressure to evaporate the washing liquid sticking to the workpiece;
    wherein said evaporating drying chamber and said washing liquid tank are provided contiguously to each other so that a workpiece to be washed can be moved directly between them, and the closing step includes the step of isolating said washing liquid tank from said evaporating drying chamber by said isolating means.

2. A washing and drying method as claimed in claim 1, wherein the closing step further includes the step of closing, prior to the isolating step thereof, an entrance of said evaporating drying chamber airtight after a workpiece to be washed has been placed into said evaporating drying chamber, and further comprising the steps of pressurizing, subsequently to the pressurizing and heating step, the inside of said evaporating drying chamber to a pressure equal to the internal pressure of said washing liquid tank with gas, and opening said isolating means to allow the workpiece to be subsequently moved from within said evaporating drying chamber into said washing liquid tank and immersed into the washing liquid in said washing liquid tank.

3. A washing and drying method as claimed in claim 2, further comprising the step of opening, after the decompressing step, said entrance of said evaporating drying chamber to open said evaporating drying chamber to the atmospheric air and allow the workpiece to be removed from within said evaporating drying chamber.

4. A washing and drying method as claimed in claim 1, wherein pure water is used as the washing liquid.

5. A washing and drying method as claimed in claim 1, wherein, at the immersing step, ultrasonic vibrations are generated from an ultrasonic vibration generator in the washing liquid.

6. A washing and drying method as claimed in claim 1, further comprising the step of preliminarily washing, prior to the closing step, a workpiece to be washed with the washing liquid in a preliminary washing tank into which the washing liquid heated in said washing liquid tank is flowed while fresh washing liquid is supplemented into said washing liquid tank.

7. A washing and drying method as claimed in claim 1, wherein said gas used inside said washing liquid tank is selected from the group consisting of air or nitrogen.

8. A washing and drying method as claimed in claim 1, wherein said gas used inside said evaporating drying chamber is selected from the group consisting of air or nitrogen.

* * * * *